United States Patent
Lu et al.

(10) Patent No.: US 7,638,859 B2
(45) Date of Patent: Dec. 29, 2009

(54) INTERCONNECTS WITH HARMONIZED STRESS AND METHODS FOR FABRICATING THE SAME

(75) Inventors: Yung-Cheng Lu, Taipei (TW); Ming-Hsing Tsai, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 280 days.

(21) Appl. No.: 11/144,742

(22) Filed: Jun. 6, 2005

(65) Prior Publication Data

US 2006/0276027 A1    Dec. 7, 2006

(51) Int. Cl.
   H01L 23/58    (2006.01)
   H01L 23/52    (2006.01)
(52) U.S. Cl. ............... 257/635; 257/637; 257/640; 257/639; 257/751; 257/758
(58) Field of Classification Search .......... 257/635, 257/637, 640, 639, 751, 774, 758; 438/622
See application file for complete search history.

(56) References Cited

U.S. PATENT DOCUMENTS

| | | | |
|---|---|---|---|
| 6,001,730 A * | 12/1999 | Farkas et al. | 438/627 |
| 6,100,184 A | 8/2000 | Zhao et al. | |
| 6,358,839 B1 | 3/2002 | Li et al. | |
| 6,362,091 B1 | 3/2002 | Andideh et al. | |
| 6,483,173 B2 | 11/2002 | Li et al. | |
| 6,750,541 B2 * | 6/2004 | Ohtsuka et al. | 257/750 |
| 6,764,958 B1 | 7/2004 | Nemani et al. | |
| 2001/0023125 A1 | 9/2001 | Nishimoto et al. | |
| 2004/0010633 A1 | 1/2004 | Ishikawa | |
| 2004/0249978 A1 | 12/2004 | Marappan et al. | |
| 2005/0001321 A1 * | 1/2005 | Hsiung et al. | 257/758 |
| 2005/0037153 A1 | 2/2005 | Schmitt et al. | |
| 2005/0093108 A1 | 5/2005 | Chang | |
| 2005/0179137 A1 * | 8/2005 | Usami | 257/762 |
| 2006/0027924 A1 * | 2/2006 | Chen et al. | 257/751 |
| 2006/0163730 A1 * | 7/2006 | Matsumoto et al. | 257/751 |

FOREIGN PATENT DOCUMENTS

| | | |
|---|---|---|
| CN | 1464553 A | 12/2003 |
| CN | 1477705 A | 2/2004 |
| CN | 1492496 A | 4/2004 |
| JP | 10-189577 A | 7/1998 |
| KR | 10-2006-0035257 A | 4/2006 |
| TW | 200515501 A | 5/1993 |
| TW | 447075 A | 7/2001 |

OTHER PUBLICATIONS

Chinese Office Action for 2006100915237.

* cited by examiner

*Primary Examiner*—Kenneth A Parker
*Assistant Examiner*—Joseph Nguyen
(74) *Attorney, Agent, or Firm*—Birch, Stewart, Kolasch & Birch, LLP

(57) ABSTRACT

Interconnects with harmonized stress and methods for fabricating the same. An interconnect comprises a substrate having a conductive member. A composite low-k dielectric layer interposed with at least one stress-harmonizing layer therein overlies the substrate. A conductive feature in the composite low-k dielectric layer passes through the at least one stress-harmonizing layer to electrically connect the conductive member.

10 Claims, 6 Drawing Sheets

INTERCONNECTS WITH HARMONIZED STRESS AND METHODS FOR FABRICATING THE SAME

BACKGROUND

The present invention relates to semiconductor features, and in particular to an interconnect for integrated circuits.

Reduction of integrated circuit feature size has resulted in levels of electrically conductive interconnects being placed closer together vertically, as well as reduction of the horizontal spacing between the electrically conductive interconnects, such as metal lines. As a result, capacitance has increased between such conductive portions, resulting in RC (resistance×conductance) delay time and crosstalk effect. One proposed approach to this problem is to replace the conventional silicon oxide ($SiO_2$) dielectric material, having a dielectric constant (k) of about 4.0, with other insulation material having a lower dielectric constant, to thereby lower capacitance.

Unfortunately, low-k dielectric materials have various problems that make integration into existing integrated circuit structures and processes difficult. Compared to conventional dielectric materials used in semiconductor fabrication, most low-k materials typically present characteristics such as high tensile stress. Such high tensile stresses accumulating in a semiconductor structure can lead to bowing or deformation, cracking, peeling, or formation of voids of a film therein, which can damage or destroy an interconnect that includes the film, affecting reliability of a resulting integrated circuit.

SUMMARY

Therefore, there is a need for an interconnect for integrated circuits with improved stress harmonization.

Interconnects with harmonized stress and methods for fabricating the same are provided. An exemplary embodiment of an interconnect comprises a substrate having a conductive member. A composite low-k dielectric layer interposed with at least one stress-harmonizing layer therein overlies the substrate. A conductive feature formed in the composite low-k dielectric layer passes through the at least one stress-harmonizing layer to electrically connect the conductive member.

An exemplary embodiment of a dual damascene structure comprises a substrate having a conductive member. A composite low-k dielectric layer interposed with at least one stress-harmonizing layer overlies the substrate. A conductive feature formed in the composite low-k dielectric layer passes through the at least one stress-harmonizing layer to electrically connect the conductive member, wherein the conductive feature comprises an underlying conductive via and an overlying conductive line stacked thereon.

An exemplary embodiment of a method for fabricating an interconnect with harmonized stress comprises providing a substrate with a conductive member thereon. A composite low-k dielectric layer interposed with at least one stress-harmonizing layer therein is formed to overlie the substrate. An opening is formed in the composite low-k dielectric and passes through the stress-harmonizing layer to expose a portion of the conductive member. The opening is filled with conductive material to form a conductive feature electrically connecting the conductive member.

A detailed description is given in the following embodiments with reference to the accompanying drawings.

BRIEF DESCRIPTION OF THE DRAWINGS

The invention can be more fully understood by reading the subsequent detailed description and examples with reference made to the accompanying drawings, wherein.

DESCRIPTION

Interconnects with harmonized stress and methods for fabricating the same are now described here in greater detail. Some embodiments of the invention, such as the exemplary embodiments describe, can potentially provide interconnects with dielectric layers with harmonized stress. In some embodiments, this can be accomplished by interposing at least one stress-harmonizing layer between dielectric layers of an interconnect, wherein the stress-harmonizing layer surrounds adjacent conductive features of an interconnect and preferably doesn't contact with a bottom or top surface of the adjacent conductive features.

In this specification, expressions such as "overlying the substrate", "above the layer", or "on the film" simply denote a relative positional relationship with respect to the surface of the base layer, regardless of the existence of intermediate layers. Accordingly, these expressions may indicate not only the direct contact of layers, but also, a non-contact state of one or more laminated layers. By use of the term "low dielectric constant" or "low-k" herein, is meant a dielectric constant (k value) less than the dielectric constant of a conventional silicon oxide. Preferably, the dielectric constant of the low-k is less than about 4.0.

FIGS. 1-4 are cross sections of a portion of a substrate during fabrication of an interconnect with harmonized stress according to an exemplary embodiment.

Figure 1:
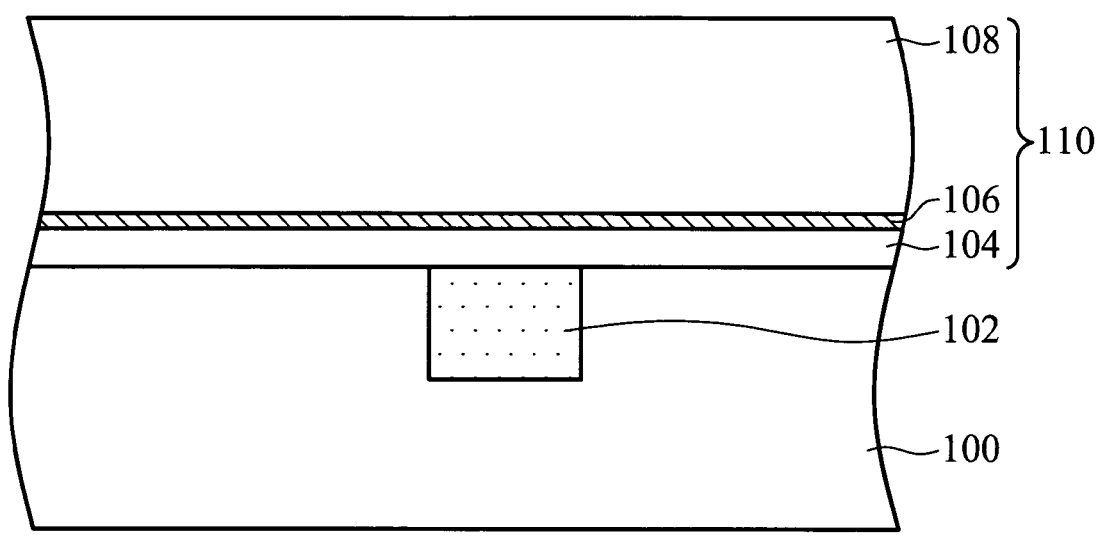
FIGS. 1-4 are cross sections of a portion of a substrate during fabrication of an interconnect with harmonized stress, according to an exemplary embodiment of the invention.

In FIG. 1, a semiconductor substrate 100, for example a silicon substrate, with semiconductor devices or other existing conductive lines thereon is first provided. The substrate 100 is illustrated as a flat substrate here for simplicity. As shown in FIG. 1, the semiconductor substrate 100 is also provided with a conductive member 102 electrically connecting one of the underlying semiconductor devices or conductive lines (both not shown).

Next, low-k dielectric layers 104 and 108 of a first type stress and a stress-harmonizing layer 106 of a second type stress are then alternatively formed over the substrate 100 and the conductive member 102. Normally, the first type stress of the low-k dielectric layers shows tensile stress and the second type stress of the stress-harmonizing layer 106 shows a compressive stress contrary to the first type stress. The low-k dielectric layers 104 and 108 may comprise dielectric materials such as carbon-doped silicon dioxide materials, fluorinated silicate glass (FSG), organic silicate glass (OSG), fluorine doped silicon oxide, spin-on glasses, silsesquioxane, benzocyclobutene (BCB)-based polymer dielectrics and any silicon containing low-k dielectric. Low-k dielectric layers 104 and 108 are formed at a thickness of about 100-3000 Å, and 100-5000 Å, respectively. Stress-harmonizing layer 106 is formed at a thickness of about 200-1000 Å. to thereby provide a compressive stress of about 50-550 MPa to thereby harmonize tensile stresses provided by the overlying and underlying low-k dielectric layers (referring to low-k dielectric layers 104 and 108). Therefore, bowing or deformation of the composite film 110 illustrated in FIG. 1 is thus prevented and cracking, peeling, or formation of voids in the composite film 110 can also be reduced. The stress-harmonizing layer 106 may comprise dielectric materials such as oxide, oxynitride, silicon carbide, nitride, silico carbide containing oxygen ($Si_aC_bO_c$) or silicon carbide containing nitrogen ($Si_xC_yN_z$), wherein a, b, c, x, y, z are formed at about 0.8-1.2, 0.8-1.2, 0-0.8, 0.8-1.2, 0.8-1.2, and 0-0.6, respectively. Preferably, the stress-harmonizing layer 106 comprises silicon carbide containing oxygen ($Si_aC_bO_c$), silicon carbide containing nitrogen ($Si_xC_yN_z$), and nitride. The stress-harmonizing layer 106 can be formed by, for example, plasma enhanced chemical vapor deposition (PECVD) and can be in-situ formed during formation of one or both of the low-k dielectric layers 104 and 108 or ex-situ formed by additional deposition.

Figure 2:
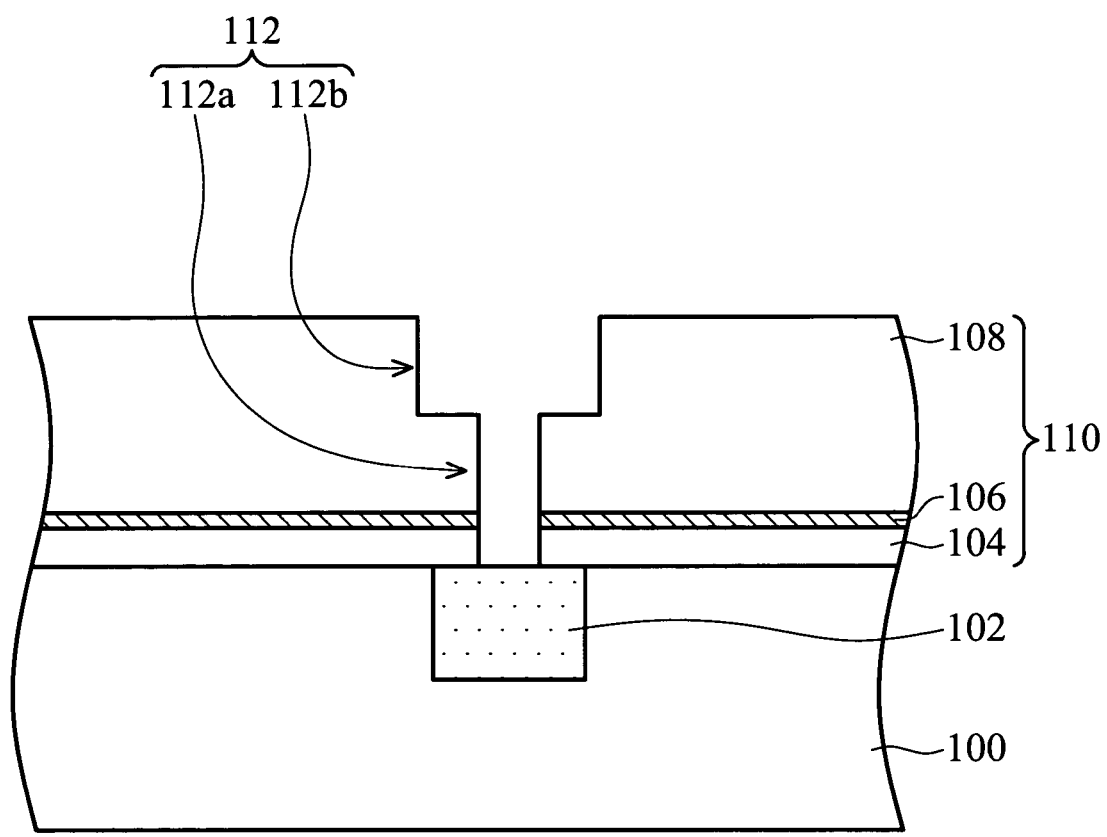

In FIG. 2, an opening 112, for example a dual damascene opening having a lower via portion 112a and an upper trench portion 112b, is then formed through the low-k dielectric layers 104, 108, and the stress-harmonizing layer 106 using a known dual damascene process of either trench first formed or via first formed. The lower via portion 112a of the opening 112 exposes a portion of the underlying conductive member 102.

The opening 112 can be formed by sequential photolithography and etching steps, wherein the etching step may be a time mode etching utilizing adequate etching chemistries to thereby reduce the use of an etch stop layer (ESL) conventionally disposed between the composite dielectric layer 110 and the substrate 100, and in the low-k dielectric layer 108 of the composite dielectric layer 110. Therefore, elevation of the overall dielectric constant of the composite layer 110 can be prevented.

Figure 3:
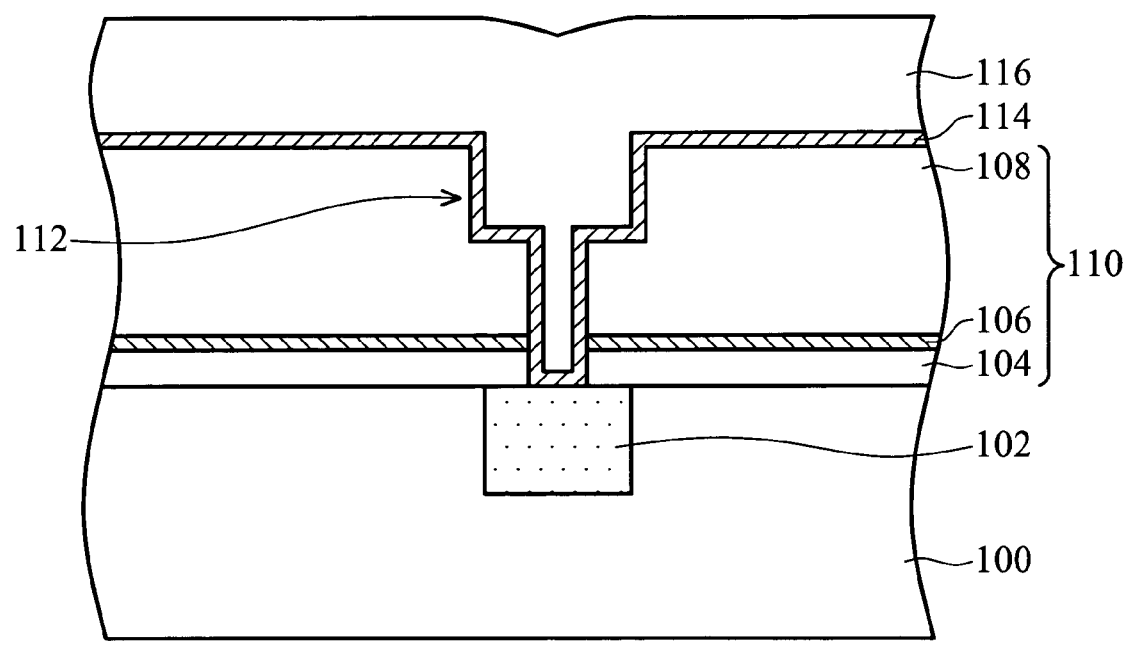

In FIG. 3, a diffusion barrier layer 114 is conformably formed in the opening 112 and over the low-k dielectric layer 108. The diffusion barrier layer 114 may comprise conductive material such as titanium (Ti), tantalum (Ta), titanium nitride (TiN), tantalum nitride (TaN), or combinations thereof. Normally, the diffusion barrier layer 114 is formed at a thickness of about 20-200 Å. Next, a conductive layer 116 of a conductive material such as copper or copper alloy is then formed in the opening 110 and over the low-k dielectric layer 108. The conductive layer 116 can be formed by known electrochemical plating (ECP) when utilizing copper or copper alloy as conductive material therein.

Figure 4:
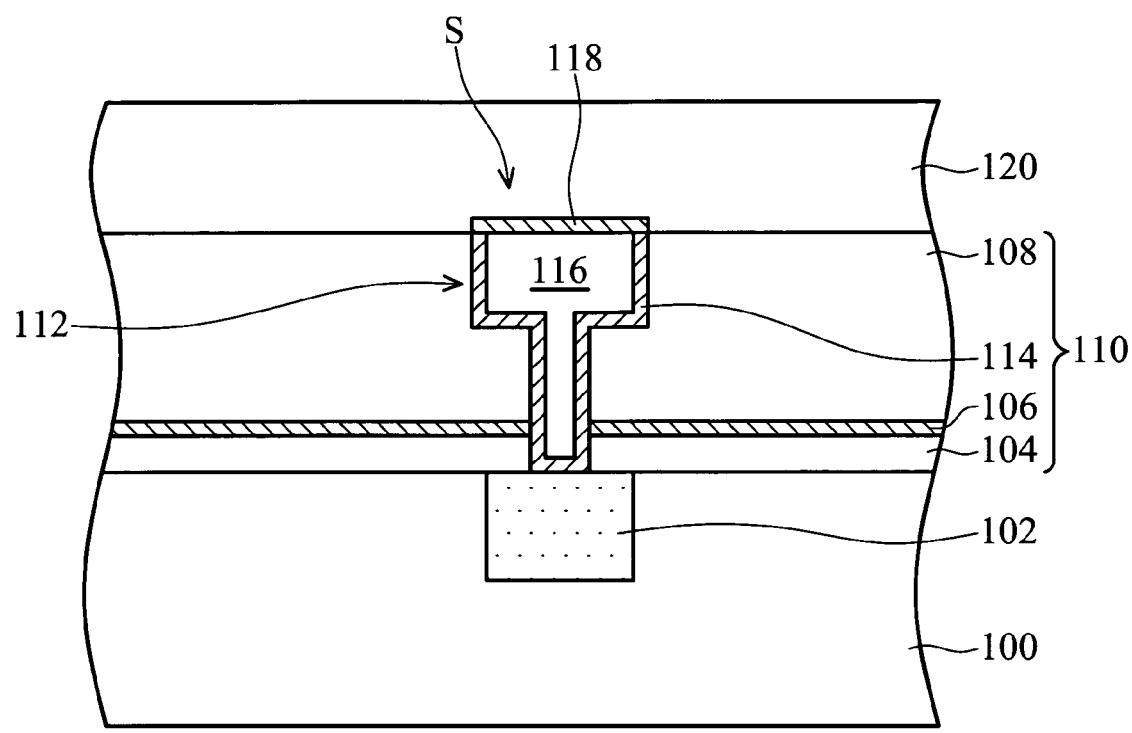

In FIG. 4, the portion of the diffusion barrier 114 and the conductive layer 116 over the opening 112 are then removed by, for example, chemical mechanical polishing (CMP), such that an interconnect with a planar surface remains. Next, an additional conductive cap 118 is selectively formed over the conductive layer 116, providing encapsulation thereof from the top. The conductive cap 118 can be selectively formed by, for example, electroless plating and may comprise conductive materials such as cobalt tungsten (CoW), cobalt phosphorus (CoP), or cobalt tungsten phosphorus (CoWP). The conductive cap 118 can be formed at a thickness of about 20-200 Å. Therefore, a conductive feature S is formed and undesired interlayer ion diffusion to the adjacent low-k dielectric layers from the conductive material, for example copper or copper alloy, of the conductive feature S can be thus eliminated or prevented. An interconnect with harmonized stress is thus formed.

Next, a dielectric layer 120 such as a low-k dielectric layer is formed over the low-k dielectric layer 108 and the conductive feature S. Sequential processes can be further performed on the dielectric layer 120 to thereby complete the integrated circuit fabrication.

In an exemplary embodiment, the interconnect is illustrated as a dual damascene structure with a conductive feature S having a conductive plug and a conductive line. The stress-harmonizing layer 106 formed in the dual damascene structure can harmonize the tensile stresses within the interconnect mainly provided by the low-k dielectric layers.

Figure 5:
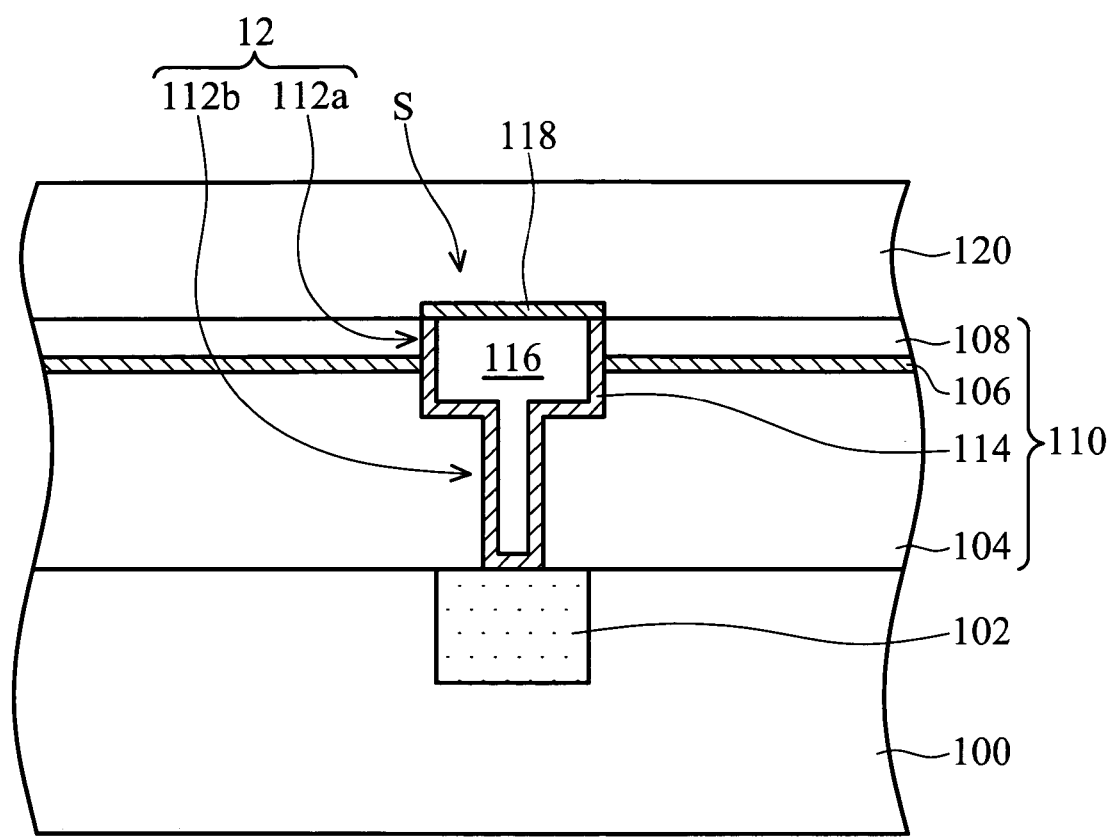
FIGS. 5-6 are schematic diagrams showing cross sections of interconnects with harmonized stress, according to various exemplary embodiments of the invention.
Figure 6:
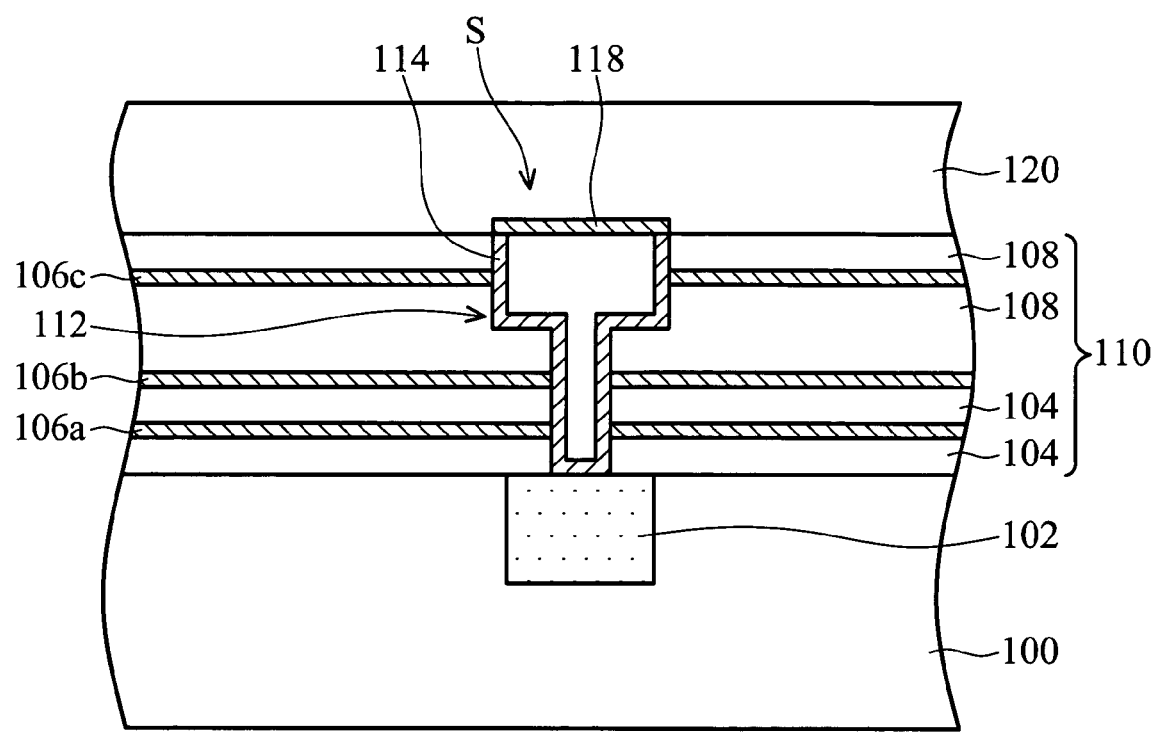

Moreover, numbers and locations of the stress-harmonizing layer 106 may vary. For example, the stress-harmonizing layer 106 may be located elsewhere than illustrated in FIG. 4. The stress-harmonizing layer 106 can be formed in the low-k dielectric layer 108 surrounding the upper trench portion 112a, as shown in FIG. 5. In addition, more than one stress-harmonizing layer (referring to the stress-harmonizing layer 106a-c) can be formed at various positions in the composite layer 110, surrounding the conductive feature S, as shown in FIG. 6.

Since there is no need for additional etch stop layers for the interconnect, the stress-harmonizing layer 106 is preferably formed at a distance from the topmost or bottommost surface of the conductive feature S for ease of fabrication.

In addition, if the etch stop layer is desired, the stress-harmonizing layer 106 may be formed at a distance from the junction of the via portion 112a and the trench portion 112b of the opening 112, thereby providing locations for formation of such etch stop layer.

In the above exemplary embodiments, the interconnects are illustrated as a dual damascene structure. It will be understood by those skilled in the art that the invention can be also applied to a single damascene structure which is not discussed here for simplicity.

As shown In FIG. 4, an embodiment of an interconnect with harmonized stress is illustrated. The interconnect includes a substrate having a conductive member. A composite low-k dielectric layer interposed with at least one stress-harmonizing layer therein overlies the substrate. A conductive feature formed in the composite low-k dielectric layer passes through the at least one stress-harmonizing layer to electrically connect the conductive member.

In the above exemplary embodiments, tensile stresses provided by the low-k dielectric layers of an interconnect are harmonized by formation of at least one stress-harmonizing layer with compress stress, preventing problems such as those occurring in a damascene structure when utilizing low-k dielectric, while improving reliability of the interconnect.

Moreover, the top surface of the conductive feature S in the interconnect can be encapsulated by a conductive cap layer to reduce need for uses of etch stop layers, with factors such as electro-migration (EM) performance of the interconnect thus ensured. The interconnect without etch stop layer is thus obtained with simplified fabrication and low cost.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An interconnect, comprising:
a substrate;
a composite low-k dielectric layer overlying the substrate;

a conductive feature passing through the composite low-k dielectric layer, wherein the conductive feature has a conductive line and a conductive plug;

a diffusion barrier layer formed on a side wall and a bottom surface of the conductive line and on a side wall and a bottom surface of the conductive plug; and at least one stress-harmonizing layer interposed in the composite low-k dielectric layer at a distance from the diffusion barrier layer on the bottom surface of the conductive line, wherein the stress-harmonizing layer comprises silicon carbide containing oxygen ($Si_aC_bO_c$), wherein a is 0.8-1.2, b is 0.8-1.2, and c is 0-0.8.

2. The interconnect of claim 1, wherein the composite low-k dielectric layer comprises a plurality of low-k dielectric portions of tensile stress interleaved with the at least one stress-harmonizing layer of compressive stress.

3. The interconnect of claim 1, further comprising a conductive cap selectively formed on a top surface of the conductive feature.

4. The interconnect of claim 1, wherein the at least one stress-harmonizing layer is formed at a thickness of about 200-1000 Å.

5. The interconnect of claim 1, wherein the at least one stress-harmonizing layer comprises a compressive stress of about 50-550 MPa.

6. The interconnect of claim 1, wherein the at least one stress-harmonizing layer does not contact the substrate or the top surface of the composite low-k dielectric layer.

7. The interconnect of claim 1, wherein the conductive feature comprises copper or copper alloy.

8. The interconnect of claim 1, wherein the diffusion barrier layer has a substantially flat middle portion in contact with the bottom surface of the conductive line, the at least one stress-harmonizing layer being spaced apart from the substantially flat middle portion of the diffusion barrier layer.

9. The interconnect of claim 1, wherein the conductive line is located above the conductive plug.

10. The interconnect of claim 9, wherein the bottom surface of the conductive line is wider the bottom surface of the conductive plug.

* * * * *